United States Patent
Lee et al.

(10) Patent No.: US 10,847,316 B2
(45) Date of Patent: Nov. 24, 2020

(54) MIM DEVICE WITH LAMINATED DIELECTRIC LAYERS

(71) Applicant: Taiwan Semiconductor Manufacturing Co., Ltd., Hsin-Chu (TW)

(72) Inventors: Cheng-Te Lee, Chupei (TW); Han-Chin Chiu, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/180,313

(22) Filed: Nov. 5, 2018

(65) Prior Publication Data
US 2020/0098518 A1 Mar. 26, 2020

Related U.S. Application Data

(60) Provisional application No. 62/733,893, filed on Sep. 20, 2018.

(51) Int. Cl.
*H01L 27/08* (2006.01)
*H01G 4/10* (2006.01)
(Continued)

(52) U.S. Cl.
CPC ............... *H01G 4/10* (2013.01); *H01G 4/20* (2013.01); *H01G 4/30* (2013.01); *H01L 23/5222* (2013.01); *H01L 27/0805* (2013.01); *H01L 28/56* (2013.01)

(58) Field of Classification Search
CPC ... H01G 4/10; H01G 4/20; H01G 4/30; H01L 28/56; H01L 27/0805; H01L 23/5222;
(Continued)

(56) References Cited

U.S. PATENT DOCUMENTS

| | | | |
|---|---|---|---|
| 2006/0151823 A1* | 7/2006 | Govindarajan | H01L 29/513 257/310 |
| 2015/0102459 A1* | 4/2015 | Lai | H01L 22/14 257/532 |
| 2015/0318343 A1* | 11/2015 | Kim | H01L 21/02178 438/396 |

OTHER PUBLICATIONS

Shu Jiang, Xiang Yang, Jianhua Zhang, and Xifeng Li, "Solution-processed stacked TiO2 and Al2O3 dielectric layers for high mobility thin film transistor", AIP Advances 8, (Aug. 2018), pp. 085109-1 to 085109-5.*

(Continued)

*Primary Examiner* — Cuong B Nguyen
(74) *Attorney, Agent, or Firm* — Eschweiler & Potashnik, LLC (57) ABSTRACT

The present disclosure relates to a MIM (metal-insulator-metal) capacitor having a laminated capacitor dielectric layer including alternating layers of high-k dielectric material and high-energy band gap material, and a method of formation. In some embodiments, the MIM capacitor has a laminated capacitor dielectric layer disposed over a capacitor bottom metal layer. The laminated capacitor dielectric layer includes a first layer of a first dielectric material, a second layer of a second dielectric material disposed on top of the first layer, a third layer of a third dielectric material disposed on top of the second layer, and a fourth layer of a fourth dielectric material disposed on top of the third layer. The first and third dielectric materials have a differing capacitance and band gap energy as compared to the second and fourth dielectric materials. A capacitor top metal layer is disposed over the laminated capacitor dielectric layer.

20 Claims, 9 Drawing Sheets

(51) Int. Cl.
    *H01G 4/30*         (2006.01)
    *H01L 23/522*     (2006.01)
    *H01L 49/02*      (2006.01)
    *H01G 4/20*         (2006.01)

(58) Field of Classification Search
    CPC ......... H01L 21/76267–76278; H01L 27/0635; H01L 27/0647–067; H01L 27/0711–0722; H01L 27/075–0783; H01L 23/5223; H01L 27/0629; H01L 27/0676; H01L 27/0716; H01L 27/0722; H01L 27/0727; H01L 27/0733; H01L 27/0788; H01L 27/0794; H01L 27/1255; H01L 27/3265
    See application file for complete search history.

(56) References Cited

OTHER PUBLICATIONS

J. Robertson, "High dielectric constant oxides", The European Physical Journal Applied Physics (2004), pp. 265-291.*

* cited by examiner

MIM DEVICE WITH LAMINATED DIELECTRIC LAYERS

REFERENCE TO RELATED APPLICATION

This application claims priority to U.S. Provisional Application No. 62/733,893 filed on Sep. 20, 2018, the contents of which are hereby incorporated by reference in their entirety.

BACKGROUND

Modern day integrated chips comprise millions or billions of transistor devices, which are configured to enable logical functionality for an integrated chip (e.g., form a processor configured to perform logic functions). Often integrated chips may also comprise passive devices, such as capacitors, resistors, inductors, varactors, etc. Metal-insulator-metal (MIM) capacitors are a common type of passive device that is often integrated into the back-end-of-the-line metal interconnect layers of integrated chips. For example, MIM capacitors may be used as decoupling capacitors configured to mitigate power supply or switching noise (e.g., switching of input/output (I/O) and core circuits) caused by changes in current flowing through various parasitic inductances associated with an integrated chip and a package in which the integrated chip is located.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MIM (metal-insulator-metal) capacitors are often implemented into the back-end-of-the-line (BEOL) metal interconnect layers of integrated chips. MIM capacitors typically have a top metal plate and a bottom metal plate separated by a capacitor dielectric layer. As the minimum feature sizes of integrated chips continue to decrease, MIM capacitors have begun to use capacitor dielectric layers comprising high-k dielectric materials. High-k dielectric materials having a relatively high dielectric constant allow for a MIM capacitor to store energy within a smaller chip area (e.g., since the capacitance of a MIM capacitor is proportional to the dielectric constant of a capacitor dielectric layer multiplied by the areas of a capacitor electrode). In certain applications, such as sensors, even higher capacitance is demanded of MIM capacitors to reduce thermal noise.

Examples of high-k materials used in MIM capacitors include $HfO_2$, $ZrO_2$, $Ta_2O_5$, $SrO$, $La_2O_5$, and $TiO_2$. However, such high-k dielectric materials typically have relatively low energy band-gaps. It has been appreciated that the low energy band-gaps can lead to increased leakage in the MIM capacitor, which can lead to reliability issues and device failure.

Accordingly, the present disclosure relates to a MIM (metal-insulator-metal) capacitor having a laminated capacitor dielectric layer comprising alternating high-k dielectric layers and high-energy band gap dielectric layers to provide high capacitance and better breakdown voltage and further relates to a method of formation. In some embodiments, the MIM (metal-insulator-metal) capacitor comprises a capacitor bottom metal layer. A laminated capacitor dielectric layer is disposed over the capacitor bottom metal layer. The laminated capacitor dielectric layer comprises alternating high-k dielectric layers and high-energy band gap dielectric layers. The high-k dielectric layers within the laminated capacitor dielectric layer provide the MIM capacitor with a high capacitance density, while the high-energy band gap dielectric layers reduce leakage by providing a higher breakdown voltage. The following description is focused on a laminated capacitor dielectric layer that includes high-k dielectric layers of the same type of high-k dielectric material and high-energy band gap dielectric layers of the same type of high-energy band gap dielectric material. It is to be understood that, in other embodiments, the laminated capacitor dielectric layer may include high-k dielectric layer of different types of high-k dielectric material and/or high-energy band gap dielectric layers of different types of high-energy band gap dielectric material.

Figure 1A:
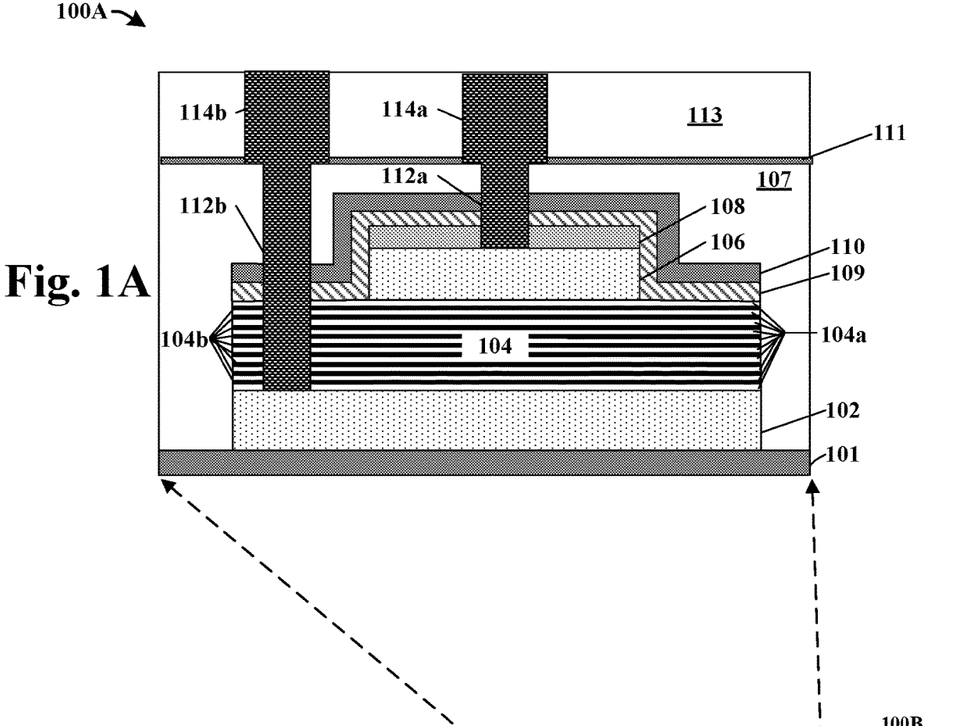
FIG. 1A illustrates a cross-sectional view of some embodiments of a metal-insulator-metal (MIM) capacitor having a laminated capacitor dielectric layer comprising alternating high-k dielectric layers and high-energy band gap dielectric layers.

FIG. 1A illustrates a cross-sectional view of some embodiments of an integrated circuit that includes a metal-insulator-metal (MIM) capacitor 100A having a laminated capacitor dielectric layer 104 comprising alternating high-k dielectric layers 104a and high-energy band gap dielectric layers 104b. The MIM capacitor 100A finds application with logic devices, complementary metal-oxide-semiconductor (CMOS) image sensors, microelectromechanical systems (MEMS) sensors, other sensors, radiofrequency (RF) devices, or any combination of the foregoing.

The MIM capacitor 100A comprises a capacitor bottom metal (CBM) layer 102 disposed on a first etch stop layer 101 and a capacitor top metal (CTM) layer 106. The first etch stop layer 101 may be disposed onto a lower metal interconnect layer (not shown) surrounded by a lower inter-level dielectric (ILD) layer within a BEOL metallization stack. In some embodiments, the lower metal interconnect layer may comprise one of a plurality of metal interconnect layers disposed between the first etch stop layer 101 and an underlying semiconductor substrate (not shown). In some embodiments, the capacitor bottom metal layer 102 and the capacitor top metal layer 106 may comprise one or more of aluminum (Al), titanium (Ti), titanium nitride (TiN), tantalum (Ta), tantalum nitride (TaN), tungsten (W), tungsten nitride (WN), copper (Cu), platinum (Pt), palladium (Pd), etc.

The capacitor bottom metal layer 102 is separated from a capacitor top metal layer 106 by the laminated capacitor dielectric layer 104. By separating the capacitor bottom metal layer 102 from the capacitor top metal layer 106 with the laminated capacitor dielectric layer 104, charges can accumulate on the capacitor bottom metal layer 102 and the capacitor top metal layer 106. The charges generate an electric field between the capacitor bottom metal layer 102 and the capacitor top metal layer 106, whereby the MIM capacitor 100A can store energy.

The laminated capacitor dielectric layer 104 comprises high-k dielectric layers 104a alternating with high-energy band gap layers 104b. For the purposes of this description the term "laminated" means having multiple thin layers of differing (e.g., alternating) material stacked atop one another. A laminated dielectric layer capacitor may have at least 4 layers (2 layers each of high-k material and high-energy band gap material). While the figures illustrate a laminated capacitor dielectric layer having 19 layers, any number of layers may be chosen depending on the desired capacitance and breakdown voltage. The thickness of the layers of different material may be the same or different. The height of the stack of layers that forms the laminated capacitor dielectric layer 104 may be controlled by controlling the thickness of layers as well as the number of layers to address packaging parameters. In some embodiments, due to the use of a laminated dielectric layer with multiple thin layers of alternating types of materials, better (e.g., higher) capacitance can be achieved with a lower dielectric constant in a capacitor dielectric layer of the same (or shorter) height as compared to capacitor dielectric layers that use three or fewer thicker layers of dielectric materials.

The high-k dielectric layers 104a comprise a high-k dielectric material (e.g., a dielectric material having a dielectric constant greater than silicon dioxide $SiO_2$) that is configured to provide the laminated capacitor dielectric layer 104 with a relatively high dielectric constant that improves energy storage of the MIM capacitor 100A. Examples of high-k materials used in MIM capacitors include $HfO_2$, $ZrO_2$, $Ta_2O_5$, SrO, $La_2O_5$, and $TiO_2$. For example, in some embodiments, the high-k dielectric layers 104a comprise a high-k dielectric material having a dielectric constant that is greater than approximately 4. Further, in some embodiments, the high-k dielectric layers 104a are or comprise a high-k dielectric material having a dielectric constant greater than that of silicon nitride (e.g., SiN) and/or greater than about 10.

The high-energy band gap layers 104b comprise a material exhibiting a relatively large energy band gap with somewhat lower dielectric constant as compared to the high-k materials in layers 104a. While the high-energy band gap layers 104 b have a lower dielectric constant k (e.g., a having a dielectric constant similar to silicon dioxide $SiO_2$), the high-energy band gap layers 104b are configured to improve dielectric breakdown of the laminated capacitor dielectric layer 104. Examples of high-energy band gap material include $SiO_2$, SiN, and $Al_2O_3$. The resulting laminated capacitor dielectric layer 104 exhibits a good capacitance density and reliability. In some embodiments, the high-energy band gap layers 104b are or comprise a material with an energy band gap that is greater than or about equal to about 5, 7, or 9.

A first metal via 112a and a second metal via 112b are configured to provide electrical connections to the capacitor top metal layer 106 and the capacitor bottom metal layer 102, respectively. The first metal via 112a vertically extends from a first metal wire 114a to a top surface of the capacitor top metal layer 106. The second metal via 112b vertically extends from a second metal wire 114b to the top surface of the capacitor bottom metal layer 102.

The high-k dielectric layers 104a have a larger dielectric constant than the high-energy band gap layers 104b. For example, in some embodiments, the high-k dielectric layers 140a may have a dielectric constant that is greater than 10, while the high-energy band gap layers 104b may have a dielectric constant that is less than 4. The larger dielectric constant of the high-k dielectric layers 140a provides the laminated capacitor dielectric layer 104 with a relatively high dielectric constant that allows for MIM capacitor 100A to have a high capacitance density (e.g., greater than 10 $fF/\mu m^2$).

The high-energy band gap layers 104b have a larger band gap than the high-k dielectric layers 104a. For example, in some embodiments, the high-energy band gap layers 104b may have a band gap of greater than 8 eV, while the high-k dielectric layers may have a band gap of less than 4.5 eV. In some embodiments, the high-k dielectric layers 104a may have a thickness of between approximately 1 and 200 angstroms and the high-energy band gap layers 104b may have a thickness of between approximately 1 and 200 angstroms. In some embodiments, the thickness of the high-k dielectric layers 104a and the thicknesses of the high-energy band gap layers 104b may be substantially the same.

In various embodiments, a ratio of the thickness of the high-k dielectric layers 104a and the thicknesses of the high-energy band gap layers 104b may be selected to be different to give MIM capacitor 100A different capacitances and/or resistances to dielectric breakdown. For example, by increasing a thickness of the high-energy band gap layers 104b relative to thicknesses of the high-k dielectric layers 104a the breakdown voltage (i.e., leakage) of the MIM capacitor 100A will be improved. Alternatively, by increasing a thickness of the high-k dielectric layer 104a relative to thicknesses of the high-energy band gap layers 104b, the capacitance of the MIM capacitor 100A will be improved.

In some embodiments, a masking layer 108 is disposed over the capacitor top metal layer 106. In some embodiments, the masking layer 108 may comprise silicon nitride (SiN), protective silicon oxy-nitride (e.g., PE-SiON), or silicon carbide (SiC). A capping layer 109 (e.g., a dielectric) may be disposed onto the masking layer 108 and the laminated capacitor dielectric layer 104. In some embodiments, the capping layer 109 may comprise an oxide layer, for example. In some embodiments, a second etch stop layer 110 may be disposed over the capping layer 109. In some embodiments, the second etch stop layer 110 may comprise silicon nitride (SiN), silicon oxy-nitride (SiON), or silicon carbide (SiC), for example. In some embodiments, an inter-level dielectric (ILD) layer 107 (e.g., an oxide, a low-k dielectric, an ultra low-k dielectric, etc.) is disposed over the second etch stop layer 110. In some embodiments, a third etch stop layer 111 is disposed over the ILD layer 107. In some embodiments, the third etch stop layer 110 may comprise silicon nitride (SiN), silicon oxy-nitride (SiON), or silicon carbide (SiC), for example. In some embodiments, the MIM capacitor 100A further comprises a second inter-level dielectric (ILD) layer 113 (e.g., an oxide, a low-k dielectric, an ultra low-k dielectric, etc.) disposed over the third etch stop layer 111.

Figure 1B:
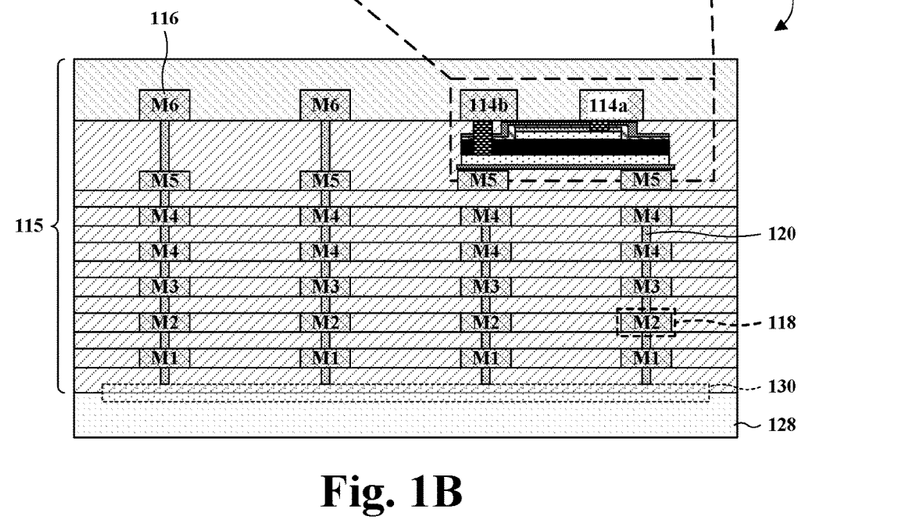
FIG. 1B illustrates an expanded cross-sectional view of some embodiments of an integrated circuitry (IC) that includes the MIM capacitor of FIG. 1A.

With reference to FIG. 1B, an expanded cross-sectional view 100B of some embodiments the IC that includes the MIM capacitor 100A of FIG. 1A is provided. As illustrated, a BEOL interconnect structure 115 is arranged over a semiconductor substrate 128 and may, for example, comprise six layers of conductive features. The semiconductor substrate 128 supports a device region 130 arranged over the semiconductor substrate 128, vertically between the semiconductor substrate 128 and the BEOL interconnect structure 115. The semiconductor substrate 128 may be, for example, a bulk semiconductor substrate, such as a bulk substrate of monocrystalline silicon or some other silicon, or a silicon-on-insulator (SOI) substrate. The device region 130 comprises electronic devices (not individually shown), such as, for example, transistors, and is electrically coupled to the layers 116 of conductive features 118 by the vias 120.

FIGS. 2, 3A-3E, and 4-8 illustrate some embodiments of cross-sectional views showing a method of forming a MIM capacitor having a laminated capacitor dielectric layer comprising alternating high-k dielectric layers and high0-energy band gap dielectric layers. Although FIGS. 2, 3A-3E, and 4-8 are described in relation to method 1100 of FIG. 11, it will be appreciated that the structures disclosed in FIGS. 2, 3A-3E, and 4-8 are not limited to such a method, but instead may stand alone as structures independent of the method.

Figure 2:
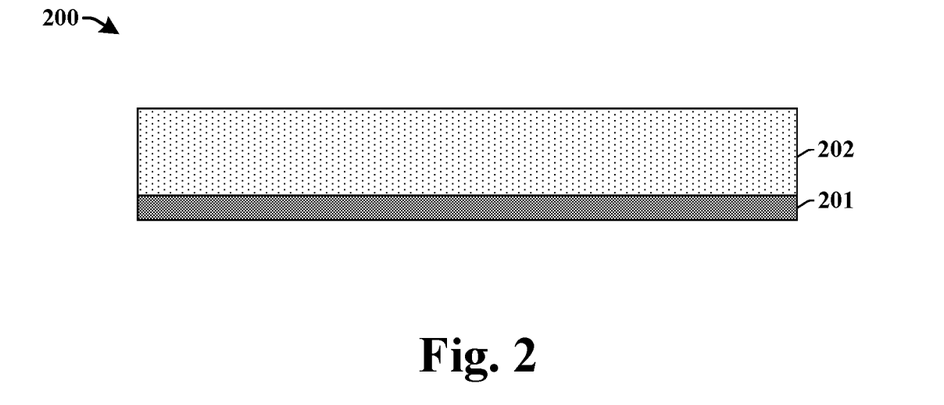
FIGS. 2, 3A-3E, and 4-8 illustrate some cross-sectional views showing an example method of forming a MIM capacitor having laminated capacitor dielectric layers comprising alternating high-k dielectric layers and high-energy band gap dielectric layers.
Figure 11:
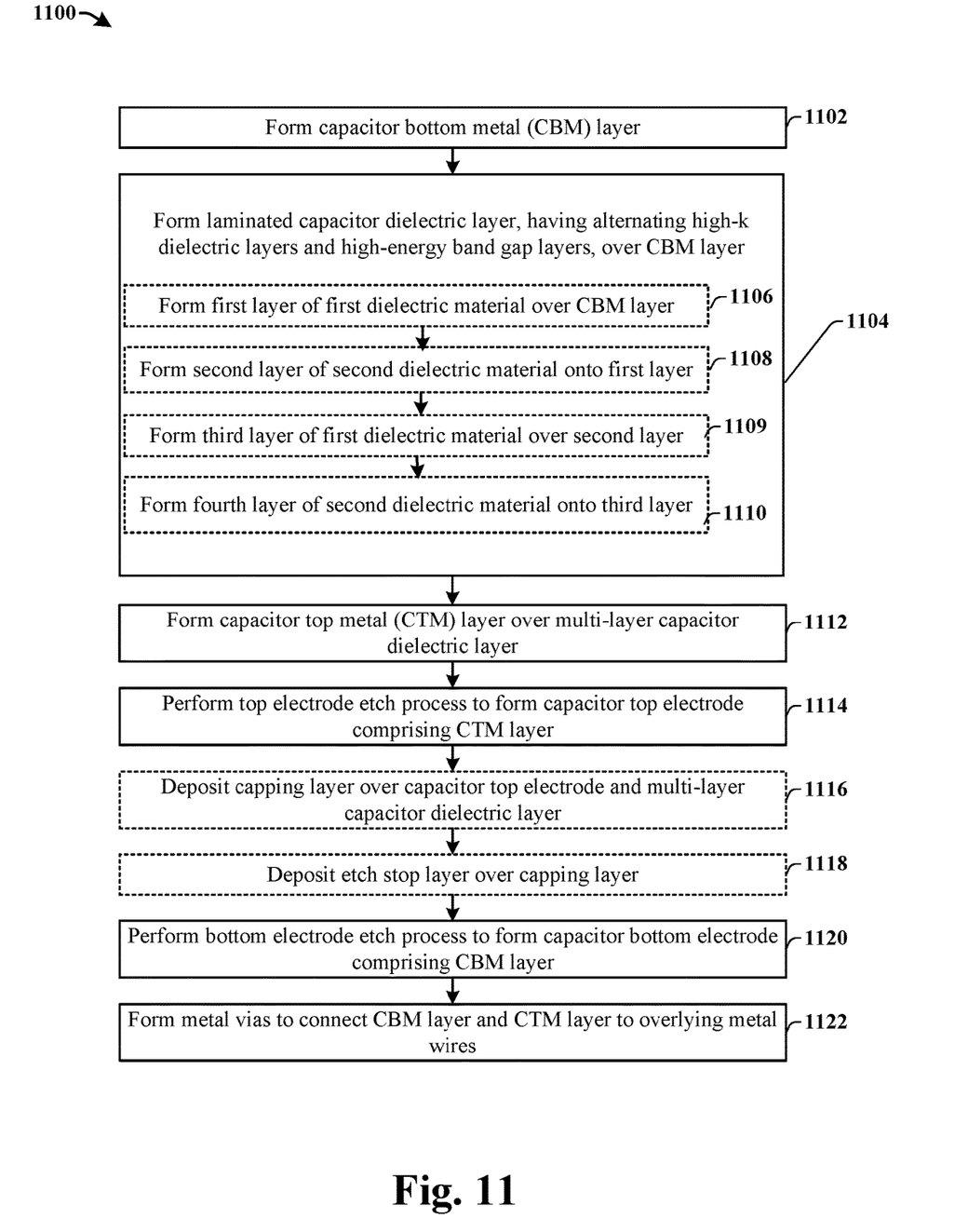
FIG. 11 illustrates a flow diagram of some embodiments of a method of forming a MIM capacitor having a laminated capacitor dielectric layer comprising alternating high-k dielectric layers and high-energy band gap dielectric layers.

FIG. 2 illustrates some embodiments of a cross-sectional view 200 corresponding to act 1102 in the flow diagram of FIG. 11.

As shown in cross-sectional view 200, a capacitor bottom metal layer 202 is formed. The capacitor bottom metal layer 202 may be deposited by way of a physical vapor deposition (PVD) process. In some embodiments, the capacitor bottom metal layer 202 may comprise titanium nitride (TiN) or tantalum nitride (TaN). In some embodiments, the capacitor bottom metal layer 202 may be deposited over a first etch stop layer 201 disposed over an underlying inter-level dielectric (ILD) layer (not shown). In some embodiments, the first etch stop layer 201 may comprise silicon carbide (SiC), for example.

FIGS. 3A-3E illustrate some embodiments of a cross-sectional views 300A-300F, corresponding to the formation of a laminated capacitor dielectric layer, as recited in act 1104.

Figure 3A:
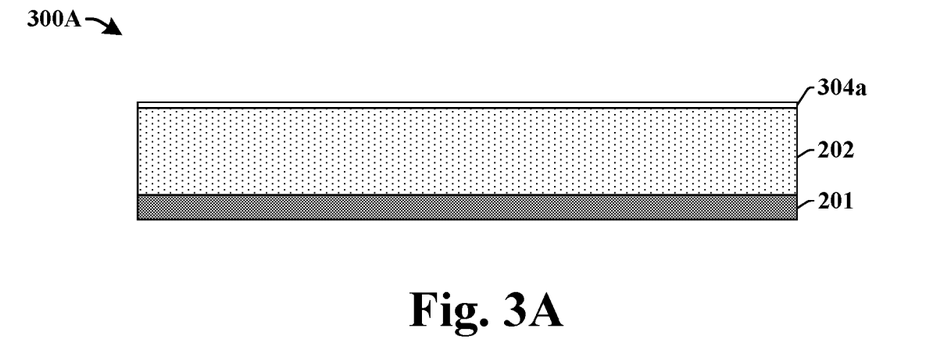

FIG. 3A illustrates some embodiments of a cross-sectional view 300A corresponding to act 1106.

As shown in cross-sectional view 300A, a first layer of a first dielectric material 304a is formed over the capacitor bottom metal layer 202. In some embodiments, first dielectric material 304a is a high-k dielectric material that may comprise $HfO_2$, $ZrO_2$, $Ta_2O_5$, SrO, $La_2O_5$, and/or $TiO_2$ formed by an atomic layer deposition (ALD) process to a thickness in a range of between approximately 1 angstrom and 200 angstroms. In other embodiments (not shown), the first dielectric material comprises a high-energy band gap material 304b such as $SiO_2$, SiN, or $Al_2O_3$ formed by an atomic layer deposition (ALD) process to a thickness in a range of between approximately 1 angstrom and 200 angstroms.

In some embodiments, the first layer may be formed using a prolonged exposure to an oxidizing agent to increase a dielectric constant of the dielectric material 304a. In some embodiments, the first layer may be formed using an ALD process that deposits a plurality of atomic layers, wherein each atomic layer is deposited using a prolonged exposure to an ozone gas ($O_3$). For example, in an n-cycle ALD process, a first cycle may be performed by introducing a TEMAZr precursor gas and ozone ($O_3$) into a processing chamber to form a first zirconium oxide atomic layer that is exposed to $O_3$ during the first cycle (e.g., for approximately 5 minutes) and during n−1 subsequent cycles. Additional cycles may be subsequently performed to form additional zirconium oxide atomic layers that are exposed to $O_3$ for prolonged times (e.g., a second atomic layer is exposed to $O_3$ during a second cycle for 5 minutes and during n−2 subsequent cycles of 5 minutes, etc.). In other embodiments, the first layer 304a may be formed using an ALD process that deposits a plurality of atomic layers, wherein a top atomic layer is deposited using a pronged exposure to an ozone gas ($O_3$).

Figure 3B:
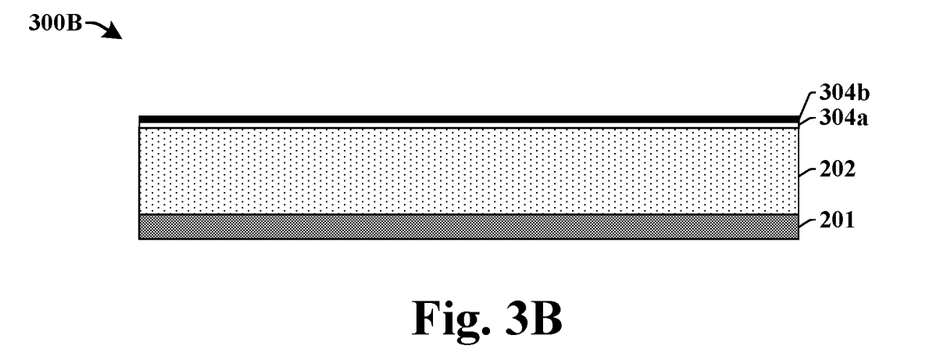

FIG. 3B illustrates some embodiments of a cross-sectional view 300B corresponding to act 1108.

As shown in cross-sectional view 300B, a second layer of a second dielectric material 304b is formed onto the first layer 304a. In some embodiments, the second dielectric material is a high-energy band gap material that may comprise $SiO_2$, SiN, and/or $Al_2O_3$ formed by an ALD process to a thickness in a range of between approximately 1 angstrom and 200 angstroms. In some embodiments, the second layer 304b may be formed using a prolonged exposure to an oxidizing agent to increase a dielectric constant of the second layer 304b. In some embodiments (not shown), the second dielectric material 304a is a high-k dielectric material that may comprise $HfO_2$, $ZrO_2$, $Ta_2O_5$, SrO, $La_2O_5$, and/or $TiO_2$ formed by an atomic layer deposition (ALD) process to a thickness in a range of between approximately 1 angstrom and 200 angstroms.

Figure 3C:
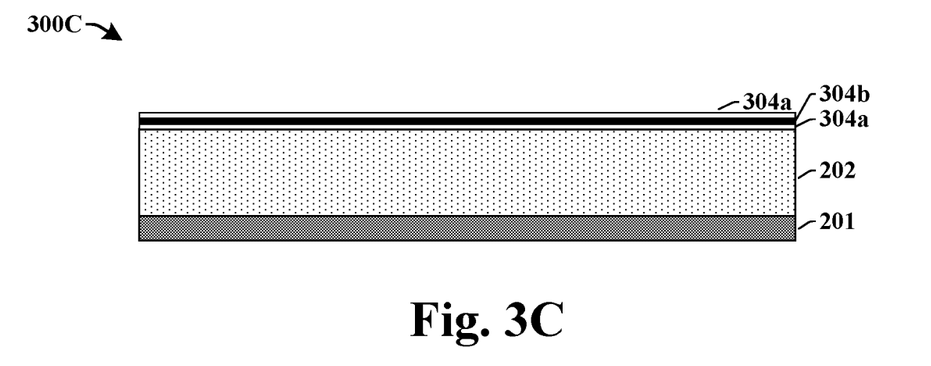

FIG. 3C illustrates some embodiments of a cross-sectional view 300C corresponding to act 1109.

As shown in cross-sectional view 300C, a third layer of the first dielectric material 304a (e.g., high-k dielectric material) is formed onto the second layer 304b.

Figure 3D:
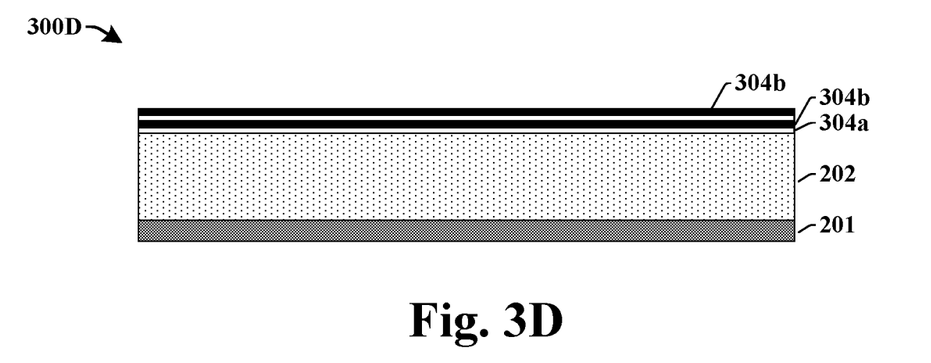

FIG. 3D illustrates some embodiments of a cross-sectional view 300D corresponding to act 1110.

As shown in cross-sectional view 300D, a fourth layer of the second dielectric material 304b (e.g., high-energy band gap dielectric material) is formed onto the third layer 304a.

Figure 3E:
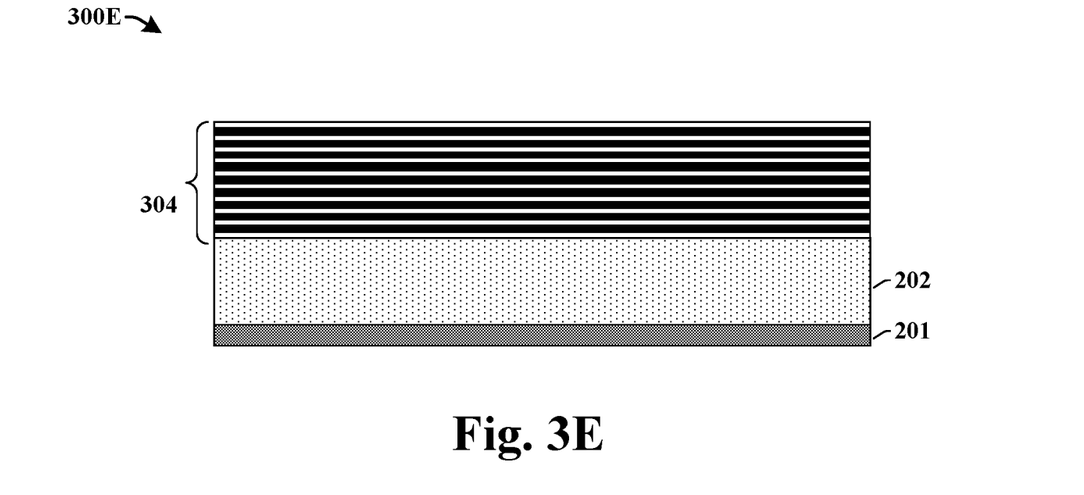

FIG. 3E illustrates some embodiments of a cross-sectional view 300E corresponding the laminated capacitor dielectric layer 304 after optional additional layers of alternating types of first and second dielectric material are formed.

Figure 4:
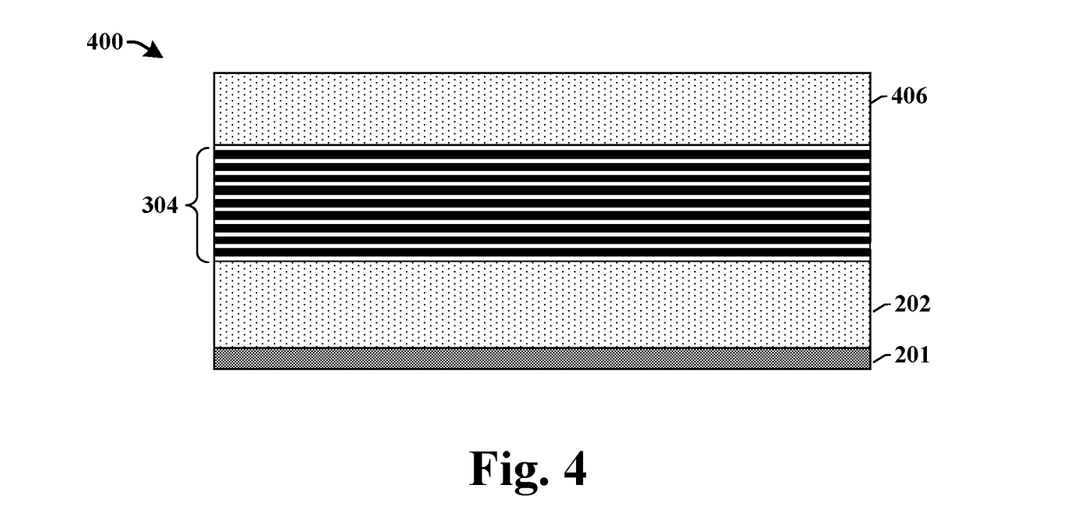

FIG. 4 illustrates some embodiments of a cross-sectional view 400 corresponding to act 1112.

As shown in cross-sectional view 400, a capacitor top metal layer 406 is formed over the laminated capacitor dielectric layer 304. In some embodiments, the capacitor top metal layer 406 may comprise titanium nitride (TiN) or tantalum nitride (TaN), for example. In some embodiments, the capacitor top metal layer 406 may be formed by way of a vapor deposition process (e.g., physical vapor deposition, chemical vapor deposition, etc.).

Figure 5:
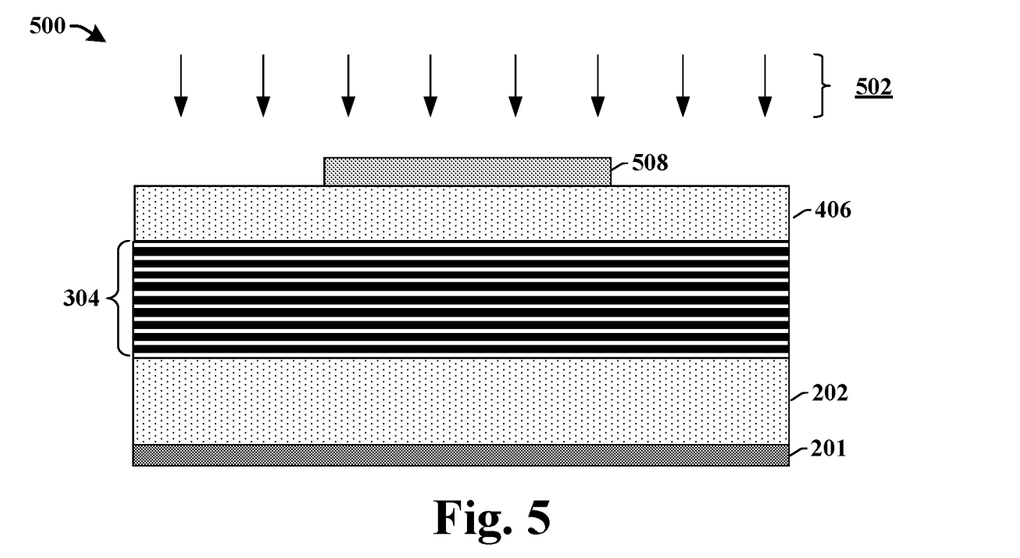

FIG. 5 illustrates some embodiments of a cross-sectional view 500 corresponding to act 1114.

As shown in cross-sectional view 500, a masking layer 508 is formed over a part of the capacitor top metal layer 406. In some embodiments, the masking layer 508 may comprise a hard mask material. For example, the masking layer 508 may comprise a protective silicon oxy-nitride (PE-SiON) layer deposited by a plasma enhanced chemical vapor deposition technique.

A top electrode etching process is subsequently performed by selectively exposing the capacitor top metal layer 406 to an etchant 502 in areas not covered by the masking layer 508. The etchant 502 removes unmasked areas of the capacitor top metal layer 406 to form a capacitor top electrode 506 (see FIG. 6) comprising the remaining capacitor top metal layer 406. In some embodiments, the etchant 502 may comprise a dry etchant (e.g., a plasma etchant, an RIE etchant, etc.).

Figure 6:
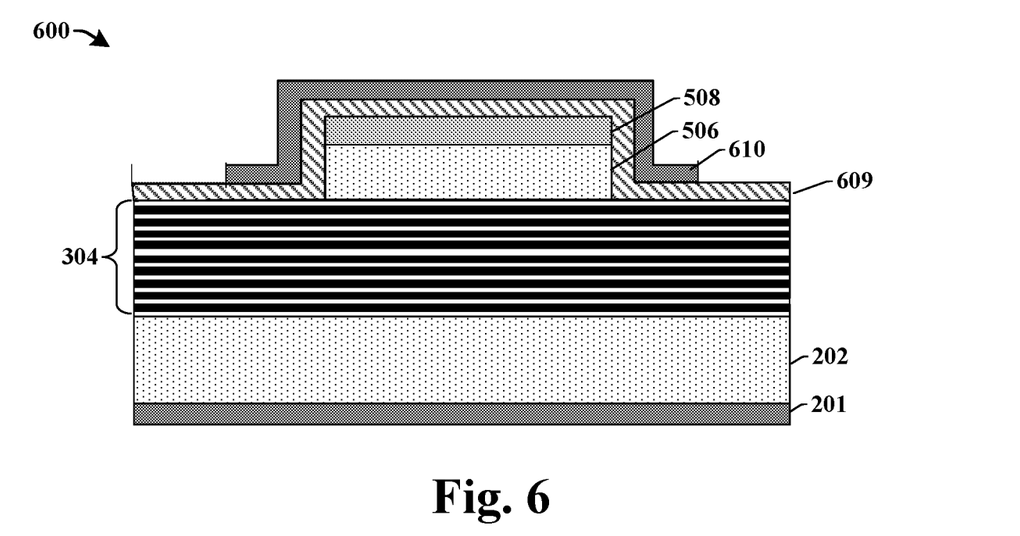

FIG. 6 illustrates some embodiments of a cross-sectional view 600 corresponding to acts 1116-1118.

As shown in cross-sectional view 600, a capping layer 609 is deposited onto the masking layer 508 and the laminated capacitor dielectric layer 304. In some embodiments, the capping layer 609 may comprise an oxide, for example. A second etch stop layer 610 is then deposited onto the capping layer 609. In some embodiments, the second etch stop layer 610 may comprise silicon nitride (SiN), for example. In some embodiments, the capping layer 609 and the second etch stop layer 610 may be deposited by way of a vapor deposition process (e.g., physical vapor deposition, chemical vapor deposition, etc.)

Figure 7:
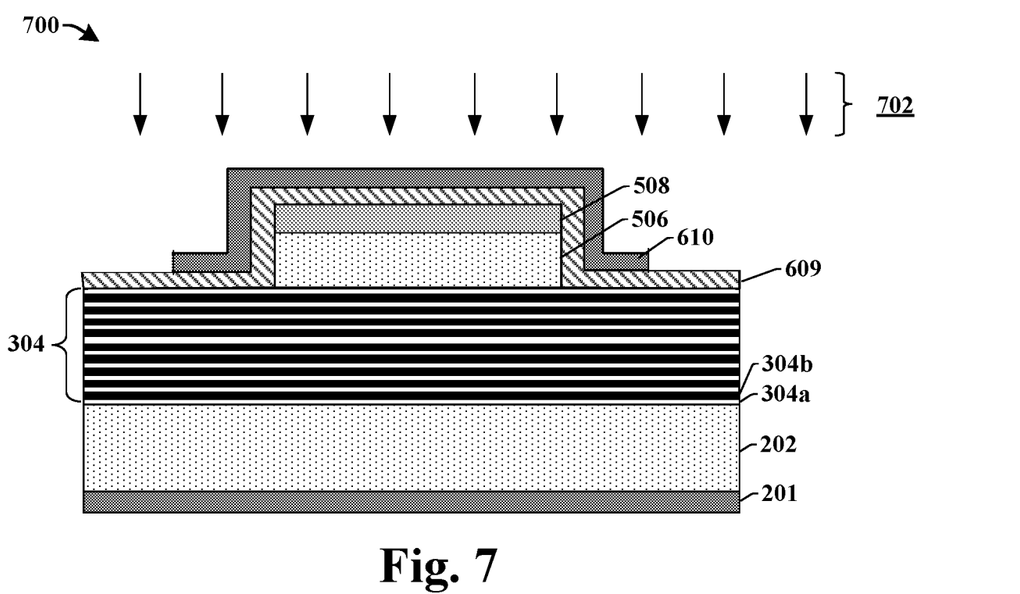

FIG. 7 illustrates some embodiments of a cross-sectional view 700 corresponding to act 1120.

As shown in cross-sectional view 700, a bottom electrode etching process is performed by selectively exposing the capacitor bottom metal layer 202 to an etchant 702. The etchant 702 removes portions of the capacitor bottom metal layer 202 to form a capacitor bottom electrode 802 (see FIG. 8) comprising a remaining portion of the capacitor bottom metal layer 202. In some embodiments, the etchant 702 may comprise a dry etchant (e.g., a plasma etchant, an RIE etchant, etc.).

Figure 8:
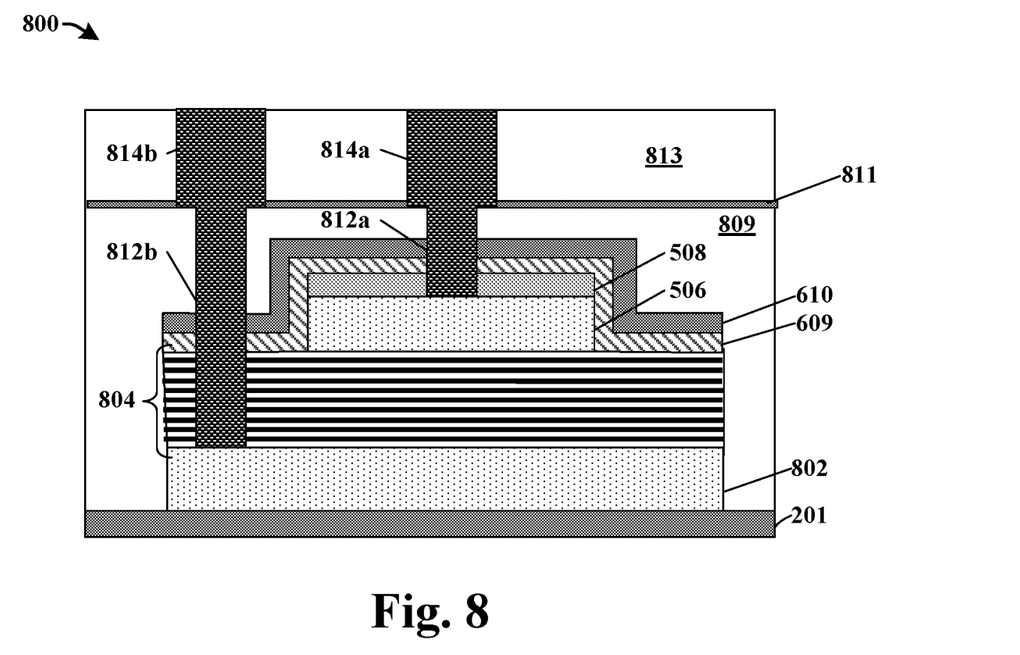

FIG. 8 illustrates some embodiments of a cross-sectional view 800 corresponding to act 1122.

As shown in cross-sectional view 800, a first metal via 812a and a second metal via 812b are formed to electrically connect first and second metal wires, 814a and 814b, to the capacitor top metal layer 506 and the capacitor bottom metal layer 802, respectively. The first and second vias, 812a and 812b, and the first and second metal wires, 814a and 814b, may be formed by depositing an inter-level dielectric (ILD) layer 809 over the second etch stop layer 610, depositing a third etch stop layer 811 over the ILD layer 809, and depositing a second inter-level dielectric (ILD) layer 813 over the third etch stop layer 811. A first etching process (e.g., a dry etching process) is performed to form via openings that extend from a top of the second ILD layer 813 to the capacitor top metal layer 506 and the capacitor bottom metal layer 802. A second etching process (e.g., a dry etching process) is performed to form wire openings that extend from a top of the second ILD layer 813 to the third etch stop layer 811 and that overlap with the via openings. Metal (e.g., copper, tungsten, aluminum, etc.) is then deposited within the via and wire openings to form the first and second vias, 112a and 112b and the first and second metal wires, 814a and 814b. In some embodiments, a different dual damascene process is used to form the first and second vias, 112a and 112b and the first and second metal wires, 814a and 814b.

Figure 9:
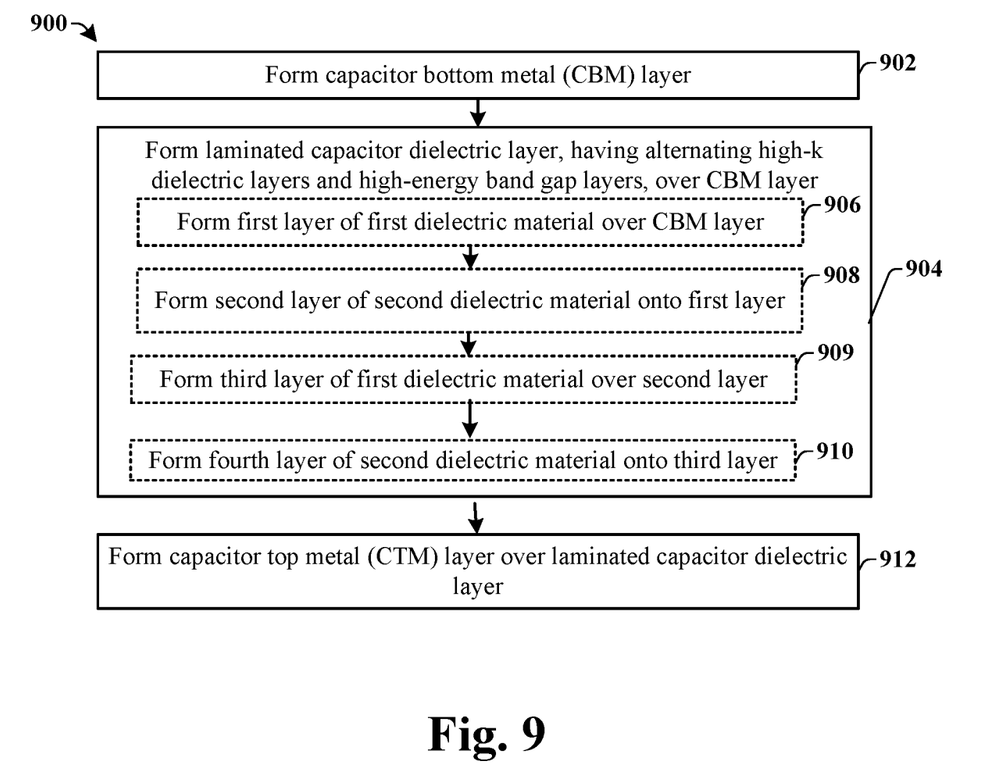
FIG. 9 illustrates a flow diagram of some embodiments of a method of forming a MIM capacitor having a laminated capacitor dielectric layer comprising alternating high-k dielectric layers and high-energy band gap dielectric layers.

FIG. 9 illustrates a flow diagram of some embodiments of a method 900 of forming a MIM capacitor having a laminated capacitor dielectric layer comprising alternating high-k dielectric layers and high-energy band gap layers.

At 902, a capacitor bottom metal (CBM) layer is formed.

At 904, a laminated capacitor dielectric layer is formed over the capacitor bottom metal layer. The laminated capacitor dielectric layer comprises alternating high-k dielectric layers and high-energy band gap layers. In some embodiments, the laminated capacitor dielectric layer may be formed by forming a first layer of a first dielectric material (e.g., a high-k dielectric material) over the capacitor bottom metal layer, subsequently forming a second layer of a second dielectric material (e.g., a high-energy band gap material) onto the first layer, subsequently forming a third layer of a third dielectric material onto the second layer, and subsequently forming a fourth layer of a fourth dielectric material onto the third layer. In some embodiments, the first and third dielectric materials comprise high-k dielectric material and the second and fourth dielectric materials comprise high-energy band gap materials. In some embodiments, the first and third dielectric materials comprise the same material and the second and fourth materials comprise the same material. In some embodiments, the laminated capacitor dielectric layer comprises may one or more additional layers of alternating first dielectric material and second dielectric material.

At 910, a capacitor top metal (CTM) layer is formed over the laminated capacitor dielectric layer.

Figure 10:
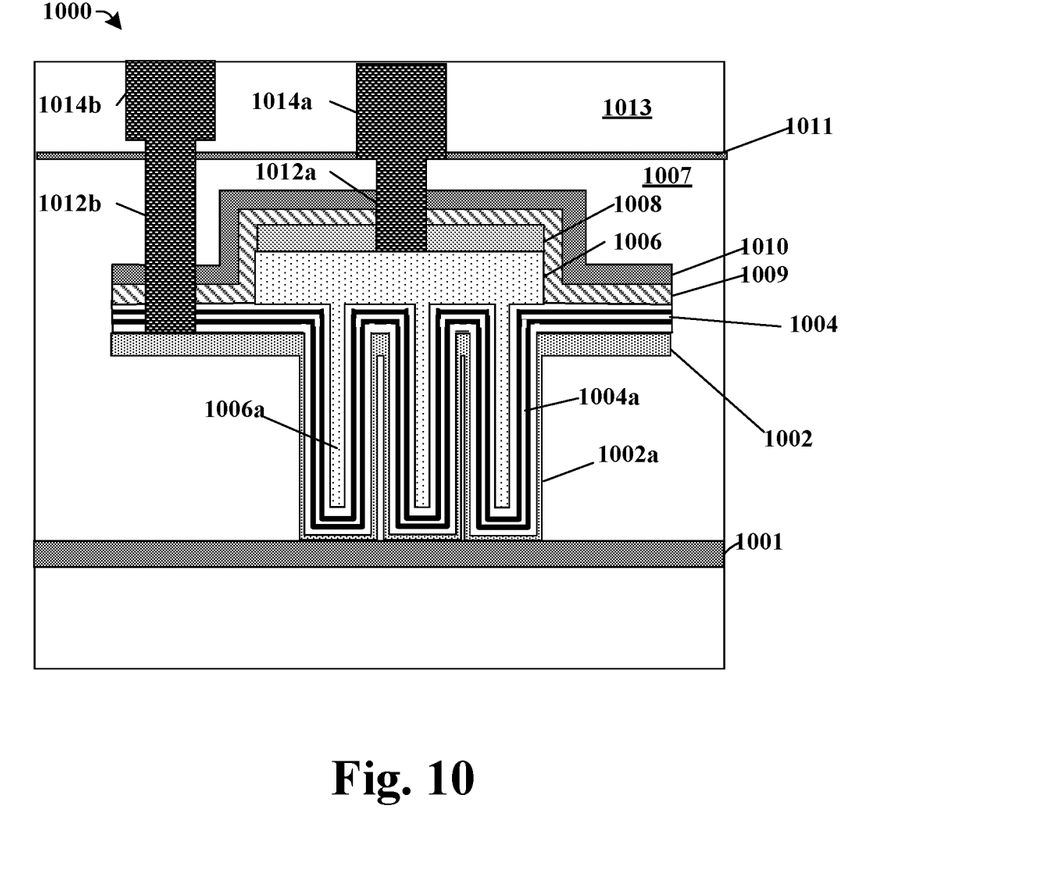
FIG. 10 illustrates a cross-sectional view of an embodiment of a three-dimensional (3D) MIM capacitor having a laminated capacitor dielectric layer comprising alternating high-k dielectric layers and high-energy band gap dielectric layers.

FIG. 10 illustrates a cross-sectional view of some embodiments of a three dimensional metal-insulator-metal (MIM) capacitor 1000 having a laminated capacitor dielectric layer 1004 comprising alternating high-k dielectric layers (white layers in FIG. 10) and high-energy band gap dielectric layers (black layers in FIG. 10).

The MIM capacitor 1000 comprises a capacitor bottom metal (CBM) layer 1002 and a capacitor top metal (CTM) layer 1006. The CBM layer 1002 is disposed on a first etch stop layer 1001. The CBM layer 1002 includes several trenches 1002a while the CTM layer 1006 includes several extensions 1006a that are configured to protrude into the trenches 1002a of the CBM layer 1002. The first etch stop layer 1001 may be disposed onto a lower metal interconnect layer (not shown) surrounded by a lower inter-level dielectric (ILD) layer within a BEOL metallization stack. In some embodiments, the lower metal interconnect layer may comprise one of a plurality of metal interconnect layers disposed between the first etch stop layer 1001 and an underlying semiconductor substrate (not shown). In some embodiments, the capacitor bottom metal layer 1002 and a capacitor top metal layer 1006 may comprise one or more of aluminum (Al), titanium (Ti), titanium nitride (TiN), tantalum (Ta), tantalum nitride (TaN), tungsten (W), tungsten nitride (WN), copper (Cu), platinum (Pt), palladium (Pd), etc.

The capacitor bottom metal layer 1002 is separated from a capacitor top metal layer 1006 by the laminated capacitor dielectric layer 1004. The laminated capacitor dielectric layer 1004 includes several trenches 1004a that are configured to be encased by the trenches 1002a. By separating the capacitor bottom metal layer 1002 from the capacitor top metal layer 1006 with the laminated capacitor dielectric layer 1004, charges can accumulate on the capacitor bottom metal layer 1002 and the capacitor top metal layer 1006. The charges generate an electric field between the capacitor bottom metal layer 1002 and the capacitor top metal layer 1006, whereby the MIM capacitor 1000 can store energy. It has been appreciated that the three dimensional shape of the CBM layer 1002, the laminated capacitor dielectric layer 1004, and the CTM layer 1006 increases the capacitance of the MIM capacitor 1000 while also improving breakdown voltage.

The laminated capacitor dielectric layer 1004 comprises high-k dielectric layers alternating with high-energy band gap layers. While FIG. 10 illustrates a laminated capacitor dielectric layer having four layers, any number of layers may be chosen depending on the desired capacitance and breakdown voltage. The thickness of the layers of different material may be the same or different. The height of the stack of layers that forms the laminated capacitor dielectric layer 1004 may be controlled by controlling the thickness of layers as well as the number of layers to address packaging parameters.

The high-k dielectric layers comprise a high-k dielectric material (e.g., a dielectric material having a dielectric constant greater than silicon dioxide $SiO_2$) that is configured to provide the laminated capacitor dielectric layer 1004 with a relatively high dielectric constant that improves energy storage of the MIM capacitor 1000. Examples of high-k materials used in MIM capacitors include $HfO_2$, $ZrO_2$, $Ta_2O_5$, SrO, $La_2O_5$, and $TiO_2$. For example, in some embodiments, the high-k dielectric layers 1004a comprise a high-k dielectric material having a dielectric constant that is greater than approximately 4. Further, in some embodiments, the high-k dielectric layers 1004a are or comprise a high-k dielectric material having a dielectric constant greater than that of silicon nitride (e.g., SiN) and/or greater than about 10.

The high-energy band gap layers comprise a material exhibiting a relatively large energy band gap with somewhat lower dielectric constant as compared to the high-k materials in layers. While the high-energy band gap layers have a lower dielectric constant k (e.g., a having a dielectric constant similar to silicon dioxide $SiO_2$), the high-energy band gap layers are configured to improve dielectric breakdown of the laminated capacitor dielectric layer 1004. Examples of high-energy band gap material include $SiO_2$, SiN, and $Al_2O_3$. The resulting laminated capacitor dielectric layer 1004 exhibits a good capacitance density and reliability.

A first metal via 1012a and a second metal via 1012b are configured to provide electrical connections to the capacitor top metal layer 1006 and the capacitor bottom metal layer 1002, respectively. The first metal via 1012a vertically extends from a first metal wire 1014a to a top surface of the capacitor top metal layer 1006. The second metal via 1012b vertically extends from a second metal wire 1014b to the top surface of the capacitor bottom metal layer 1002.

The high-k dielectric layers have a larger dielectric constant than the high-energy band gap layers. For example, in some embodiments, the high-k dielectric layers may have a dielectric constant that is greater than 10, while the high-energy band gap layers may have a dielectric constant that is less than 4. The larger dielectric constant of the high-k dielectric layers provides the laminated capacitor dielectric layer 1004 with a relatively high dielectric constant that allows for MIM capacitor 1000 to have a high capacitance density (e.g., greater than 10 $fF/\mu m^2$).

The high-energy band gap layers 104b have a larger band gap than the high-k dielectric layers 104a. For example, in some embodiments, the high-energy band gap layers 104b may have a band gap of greater than 8 eV, while the high-k dielectric layers may have a band gap of less than 4.5 eV. In some embodiments, the high-k dielectric layers 104a may have a thickness of between approximately 1 and 200 angstroms and the high-energy band gap layers 104b may have a thickness of between approximately 1 and 200 angstroms. In some embodiments, the thickness of the high-k dielectric layers 104a and the thicknesses of the high-energy band gap layers 104b may be substantially the same.

In various embodiments, a ratio of the thickness of the high-k dielectric layers 104a and the thicknesses of the high-energy band gap layers 104b may be selected to be different to give MIM capacitor 100A different capacitances and/or resistances to dielectric breakdown. For example, by increasing a thickness of the high-energy band gap layers 104b relative to thicknesses of the high-k dielectric layers 104a the breakdown voltage (i.e., leakage) of the MIM capacitor 100A will be improved. Alternatively, by increasing a thickness of the high-k dielectric layer 104a relative to thicknesses of the high-energy band gap layers 104b, the capacitance of the MIM capacitor 100A will be improved.

In some embodiments, a masking layer 1008 is disposed over the capacitor top metal layer 106. In some embodiments, the masking layer 1008 may comprise silicon nitride (SiN), protective silicon oxy-nitride (e.g., PE-SiON), or silicon carbide (SiC). A capping layer 1009 (e.g., a dielectric) may be disposed onto the masking layer 1008 and the laminated capacitor dielectric layer 1004. In some embodiments, the capping layer 1009 may comprise an oxide layer, for example. In some embodiments, a second etch stop layer 1010 may be disposed over the capping layer 1009. In some embodiments, the second etch stop layer 1010 may comprise silicon nitride (SiN), silicon oxy-nitride (SiON), or silicon carbide (SiC), for example. In some embodiments, an inter-level dielectric (ILD) layer 1007 (e.g., an oxide, a low-k dielectric, an ultra low-k dielectric, etc.) is disposed over the second etch stop layer 1010. In some embodiments, a third etch stop layer 1011 is disposed over the ILD layer 1007. In some embodiments, the third etch stop layer 1010 may comprise silicon nitride (SiN), silicon oxy-nitride (SiON), or silicon carbide (SiC), for example. In some embodiments, a second inter-level dielectric (ILD) layer 1013 (e.g., an oxide, a low-k dielectric, an ultra low-k dielectric, etc.) is disposed over the third etch stop layer 1011.

FIG. 11 illustrates a flow diagram of an embodiment of a method 1100 of forming a MIM capacitor having a laminated capacitor dielectric layer comprising alternating high-k dielectric layers and high-energy band gap dielectric layers. The method 1100 was previously outlined with respect to FIGS. 2, 3A-3E, and 4-8 above.

At 1102, a capacitor bottom metal layer is formed.

At 1104, a laminated capacitor dielectric layer is formed over the capacitor bottom metal layer. In some embodiments, the laminated capacitor dielectric layer is formed by forming a first layer of a first dielectric material (e.g., a high-k dielectric material) over the capacitor bottom metal layer at 1106, subsequently forming a second layer of a second dielectric material (e.g., a high-energy band gap material) onto the first layer at 1108, subsequently forming a third layer of a third dielectric material onto the second layer at 1109, and subsequently forming a fourth layer of a fourth dielectric material onto the third layer at 1110. In some embodiments, the laminated capacitor dielectric layer comprises may one or more additional layers of alternating first dielectric material and second dielectric material.

At 1112, a capacitor top metal layer is formed onto the laminated capacitor dielectric layer.

At 1114, a top electrode etch process is performed to pattern the capacitor top metal layer to form a capacitor top electrode.

At 1116, a capping layer may be formed over the capacitor top electrode and the laminated capacitor dielectric layer, in some embodiments.

At 1118, an etch stop layer may be formed over the capping layer, in some embodiments.

At 1120, a bottom electrode etch process is performed to pattern the capacitor bottom metal layer to form a capacitor bottom electrode. The bottom electrode etch process may also pattern the laminated capacitor dielectric layer, the capping layer, and/or the etch stop layer.

At 1122, metal vias are formed to connect the capacitor bottom metal layer (i.e., the capacitor bottom electrode) and the capacitor top metal layer (i.e., the capacitor top electrode) to overlying metal wires.

While the disclosed methods (e.g., methods 900 and 1100) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Therefore, the present disclosure relates to a method of forming a MIM (metal-insulator-metal) capacitor having a laminated capacitor dielectric layer, comprising alternating high-k dielectric layers and high-energy band gap dielectric layers.

In some embodiments, the present disclosure relates to a MIM (metal-insulator-metal) capacitor, including a capacitor bottom metal layer, a laminated capacitor dielectric layer, and a capacitor top metal layer. The laminated capacitor dielectric layer is disposed over the capacitor bottom metal layer. The laminated capacitor dielectric layer includes a first layer of a first dielectric material disposed on top of the capacitor bottom metal layer, a second layer of a second dielectric material disposed on top of the first layer, a third layer of a third dielectric material disposed on top of the second layer, and a fourth layer of a fourth dielectric material disposed on top of the third layer. The first dielectric material and the third dielectric material have a differing capacitance and band gap energy as compared to the second dielectric material and the fourth dielectric material. The capacitor top metal layer is disposed over the laminated capacitor dielectric layer.

In yet other embodiments, the present disclosure relates to a method of forming a MIM (metal-insulator-metal) capacitor. The method comprises forming a capacitor bottom metal layer and forming a laminated capacitor dielectric layer over the capacitor bottom metal layer. The laminated capacitor dielectric layer is formed by forming a first layer of a first dielectric material over the capacitor bottom metal layer, subsequently forming a second layer of a second dielectric material onto the first layer, subsequently forming a third layer of a third dielectric material onto the second layer, and subsequently forming a fourth layer of a fourth dielectric material onto the third layer. The first dielectric material and the third dielectric material have a differing capacitance and band gap energy as compared to the second dielectric material and the fourth dielectric material. A capacitor top metal layer is formed over the laminated capacitor dielectric layer.

In other embodiments, the present disclosure relates to an integrated circuit that includes MIM (metal-insulator-metal) capacitor. The MIM capacitor includes a semiconductor substrate; an interconnect structure disposed over the semiconductor substrate, and including a plurality of dielectric layers and a plurality of metal layers stacked over one another in alternating fashion. The plurality of metal layers includes an upper metal layer. A capacitor bottom metal layer is in electrical contact with the upper metal layer. A laminated capacitor dielectric layer is disposed over the capacitor bottom metal layer. The laminated capacitor dielectric layer comprises a first layer of a first dielectric material disposed on top of the capacitor bottom metal layer, a second layer of a second dielectric material disposed on top of the first layer, a third layer of a third dielectric material disposed on top of the second layer, and a fourth layer of a fourth dielectric material disposed on top of the third layer. The first dielectric material and the third dielectric material have a differing capacitance and band gap energy as compared to the second dielectric material and the fourth dielectric material. A capacitor top metal layer is disposed over the laminated capacitor dielectric layer and in electrical contact with the upper metal layer The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A MIM (metal-insulator-metal) capacitor, comprising:
   a capacitor bottom metal layer;
   a laminated capacitor dielectric layer disposed over the capacitor bottom metal layer, wherein the laminated capacitor dielectric layer comprises a first layer of a first dielectric composite material disposed on top of the capacitor bottom metal layer, a second layer of a second dielectric composite material disposed on top of the first layer, a third layer of the first dielectric composite material disposed on top of the second layer, and a fourth layer of the second dielectric composite material disposed on top of the third layer,
   wherein the first dielectric composite material has a differing capacitance and band gap energy as compared to the second dielectric composite material, and wherein the first dielectric composite material comprises multiple high-k dielectric materials having high dielectric constants relative to the second dielectric composite material, and the second dielectric composite material comprises multiple high-energy band gap dielectric materials having high energy band gaps relative to the first dielectric composite material, or vice-versa; and
a capacitor top metal layer disposed over the laminated capacitor dielectric layer.

2. The MIM capacitor of claim 1, wherein the first layer, the second layer, the third layer, and the fourth layer have a same thickness.

3. The MIM capacitor of claim 1, wherein the first layer and the third layer have a thickness that is in a range of between approximately 1 and 200 angstroms.

4. The MIM capacitor of claim 1, wherein the second layer and the fourth layer have a thickness that is in a range of between approximately 1 and 200 angstroms.

5. The MIM capacitor of claim 1, wherein the high-k dielectric materials comprise $HfO_2$, $ZrO_2$, $Ta_2O_5$, SrO, $La_2O_5$, $TiO_2$, or any combination of the foregoing.

6. The MIM capacitor of claim 1, wherein the high-energy band gap dielectric materials comprise $SiO_2$, SiN, or $Al_2O_3$.

7. The MIM capacitor of claim 1, wherein the first dielectric composite material comprises a first high-energy band gap dielectric material with a band gap energy greater than 9, and wherein the second composite dielectric material comprises a first high-k dielectric material with a dielectric constant greater than 10.

8. A method of forming a MIM (metal-insulator-metal) capacitor, comprising:
forming a capacitor bottom metal layer;
forming a laminated capacitor dielectric layer over the capacitor bottom metal layer, wherein the forming of the laminated capacitor dielectric layer comprises forming a first layer of a first dielectric material over the capacitor bottom metal layer, subsequently forming a second layer of a second dielectric material onto the first layer, subsequently forming a third layer of the first dielectric material onto the second layer, and subsequently forming a fourth layer of the second dielectric material onto the third layer,
wherein the first dielectric material has a differing capacitance and band gap energy as compared to the second dielectric material, and wherein the first dielectric material has a first band gap energy greater than 8 eV, and the second dielectric material has a dielectric constant greater than 10 and a second band gap energy less than 4.5 eV, or vice versa;
forming a capacitor top metal layer over the laminated capacitor dielectric layer; and
forming a metal via extending from a top of the capacitor bottom metal layer through the laminated capacitor dielectric layer such that the metal via laterally and directly contacts each individual dielectric layer of the laminated capacitor dielectric layer.

9. The method of claim 8, comprising forming the first layer, the second layer, the third layer, and the fourth layer to have a same thickness.

10. The method of claim 8, comprising forming the first layer and the third layer to have a thickness that is in a range of between approximately 1 and 200 angstroms.

11. The method of claim 8, comprising forming the second layer and the fourth layer to have a thickness that is in a range of between approximately 1 and 200 angstroms.

12. The method of claim 8, wherein the second dielectric material comprises $HfO_2$, $ZrO_2$, $Ta_2O_5$, SrO, $La_2O_5$, $TiO_2$, or any combination of the foregoing.

13. The method of claim 8, wherein the first dielectric material comprises $SiO_2$, SiN, and $Al_2O_3$.

14. An integrated circuit, comprising:
a semiconductor substrate;
an interconnect structure disposed over the semiconductor substrate, and including a plurality of dielectric layers, a first metal via, and a plurality of metal layers stacked over one another, wherein the plurality of metal layers includes an upper metal layer defining a first metal wire;
a capacitor bottom metal layer in electrical contact with the upper metal layer;
a laminated capacitor dielectric layer disposed over the capacitor bottom metal layer, wherein the laminated capacitor dielectric layer comprises a first layer of a first dielectric material disposed on top of the capacitor bottom metal layer, a second layer of a second dielectric material disposed on top of the first layer, a third layer of a third dielectric material disposed on top of the second layer, and a fourth layer of a fourth dielectric material disposed on top of the third layer,
wherein the first dielectric material and the third dielectric material have a differing capacitance and band gap energy as compared to the second dielectric material and the fourth dielectric material; and
a capacitor top metal layer disposed over the laminated capacitor dielectric layer and in electrical contact with the upper metal layer;
wherein the first metal via extends from the first metal wire to the capacitor bottom metal layer while laterally and directly contacting each individual dielectric layer in the laminated capacitor dielectric layer.

15. The integrated circuit of claim 14, wherein the first dielectric material and the third dielectric material each individually comprise a first high-k dielectric material with a dielectric constant greater than 10, and wherein the second dielectric material and the fourth dielectric material each individually comprise a first high-energy band gap dielectric material with a band gap energy greater than 9.

16. The integrated circuit of claim 15, wherein the first dielectric material and the third dielectric material each individually comprise a second high-k dielectric material that is different than the first high-k dielectric material and that comprises $HfO_2$, $ZrO_2$, $Ta_2O_5$, SrO, $La_2O_5$, $TiO_2$, or any combination of the foregoing, and wherein the second dielectric material and fourth dielectric material each individually comprise a second high-energy band gap dielectric material that is different than the first high-energy band gap dielectric material and that comprises $SiO_2$, SiN, or $Al_2O_3$.

17. The MIM capacitor according to claim 1, wherein the first dielectric composite material comprises a first high-k dielectric material, wherein the second dielectric composite material comprises a second high-k dielectric material, and wherein the first high-k dielectric material has a higher energy band gap and a lower dielectric constant than the second high-k dielectric material.

18. The MIM capacitor of claim 1, further comprising:
a metal via and a metal wire, wherein the metal via extends from the metal wire to the capacitor bottom metal layer;
wherein the metal via laterally and directly contacts each individual dielectric layer in the laminated capacitor dielectric layer.

19. The integrated circuit of claim 15, wherein the first dielectric material has a dielectric constant greater than 19 and a second band gap energy less than 4.5 eV, and wherein the second dielectric material has a first band gap energy greater than 8 eV.

20. The integrated circuit of claim 14, wherein the first layer and the third layer have a thickness that is in a range of between approximately 1 and 200 angstroms.

* * * * *